US012712165B2

(12) United States Patent
Shimizu et al.

(10) Patent No.: US 12,712,165 B2
(45) Date of Patent: Aug. 18, 2026

(54) SEASONING METHOD AND PLASMA PROCESSING APPARATUS

(71) Applicant: Tokyo Electron Limited, Tokyo (JP)

(72) Inventors: Yusuke Shimizu, Kurokawa-gun (JP); Satoru Nakamura, Kurokawa-gun (JP); Toshihisa Ozu, Kurokawa-gun (JP); Naoki Matsumoto, Kurokawa-gun (JP)

(73) Assignee: Tokyo Electron Limited, Tokyo (JP)

(*) Notice: Subject to any disclaimer, the term of this patent is extended or adjusted under 35 U.S.C. 154(b) by 267 days.

(21) Appl. No.: 18/225,077

(22) Filed: Jul. 21, 2023

(65) Prior Publication Data

US 2024/0030014 A1 Jan. 25, 2024

(30) Foreign Application Priority Data

Jul. 22, 2022 (JP) ................................ 2022-117515
Jun. 22, 2023 (JP) ................................ 2023-102510

(51) Int. Cl.
*H01J 37/32* (2006.01)

(52) U.S. Cl.
CPC .... *H01J 37/3299* (2013.01); *H01J 37/32724* (2013.01); *H01J 2237/2007* (2013.01); *H01J 2237/24585* (2013.01)

(58) Field of Classification Search
CPC ............ H01J 37/3299; H01J 37/32724; H01J 2237/2007; H01J 2237/24585
See application file for complete search history.

(56) References Cited

U.S. PATENT DOCUMENTS

2016/0211165 A1* 7/2016 McChesney ...... H01L 21/67069
2020/0176228 A1* 6/2020 Oka .................. H01J 37/32449
2020/0365405 A1* 11/2020 Zucker ............. H01J 37/32899
2021/0265143 A1* 8/2021 Endo .................. H01L 21/6833

FOREIGN PATENT DOCUMENTS

JP 2010-147052 A 7/2010

* cited by examiner

*Primary Examiner* — Yuechuan Yu
(74) *Attorney, Agent, or Firm* — PROCOPIO, CORY, HARGREAVES & SAVITCH LLP

(57) ABSTRACT

A seasoning method implemented in a plasma processing apparatus is provided. The plasma processing apparatus comprises a chamber and an electrostatic chuck, the electrostatic chuck including a central region which supports a substrate and an annular region which surrounds the central region and supports a ring assembly, the seasoning method includes: disposing the ring assembly on the annular region of the electrostatic chuck; disposing the substrate on the central region of the electrostatic chuck; forming a plasma in the chamber; calculating a thermal resistance between the electrostatic chuck and the ring assembly; and determining, based on the calculated thermal resistance, whether to repeat the forming the plasma and the calculating the thermal resistance.

13 Claims, 14 Drawing Sheets

$$q_h = q_{h0} - q_F - \frac{R_{th} \cdot A \cdot q_F}{R_{thc} \cdot A \cdot (\lambda_1 - \lambda_2)} \left\{ \left( 1 + \frac{a_2 + a_3}{a_1 \cdot a_3} \cdot \lambda_2 \right) (a_1 + \lambda_1) \exp\left( -\frac{t}{\tau_1} \right) - \left( 1 + \frac{a_2 + a_3}{a_1 \cdot a_3} \cdot \lambda_1 \right) (a_1 + \lambda_2) \exp\left( -\frac{t}{\tau_2} \right) \right\} \quad \cdots (1)$$

$$q_h = P_h / A \quad \cdots (2)$$

$$q_{h0} = P_{h0} / A \quad \cdots (3)$$

$$R_{thc} \cdot A = \frac{z_c}{\kappa_c} \quad \cdots (4)$$

$$a_1 = \frac{1}{\rho_w \cdot C_w \cdot z_w \cdot R_{th} \cdot A} \quad \cdots (5)$$

$$a_2 = \frac{2}{\rho_c \cdot C_c \cdot z_c \cdot R_{th} \cdot A} \quad \cdots (6)$$

$$a_3 = \frac{2}{\rho_c \cdot C_c \cdot z_c \cdot R_{thc} \cdot A} \quad \cdots (7)$$

$$\lambda_1 = \frac{1}{2} \left\{ -(a_1 + a_2 + a_3) + \sqrt{(a_1 + a_2 + a_3)^2 - 4a_1a_3} \right\} \quad \cdots (8)$$

$$\lambda_2 = \frac{1}{2} \left\{ -(a_1 + a_2 + a_3) - \sqrt{(a_1 + a_2 + a_3)^2 - 4a_1a_3} \right\} \quad \cdots (9)$$

$$\tau_1 = -\frac{1}{\lambda_1} \quad \cdots (10)$$

$$\tau_2 = -\frac{1}{\lambda_2} \quad \cdots (11)$$

Fig. 12

$$T_w = T_b + q_p \cdot (R_{th} \cdot A + R_{thc} \cdot A) + \frac{q_p}{\rho_w \cdot C_w \cdot z_w \cdot (\lambda_1 - \lambda_2)} \left\{ \left( 1 + \frac{a_2 + a_3}{a_1 \cdot a_3} \cdot \lambda_2 \right) \exp\left( -\frac{t}{\tau_1} \right) - \left( 1 + \frac{a_2 + a_3}{a_1 \cdot a_3} \cdot \lambda_1 \right) \exp\left( -\frac{t}{\tau_2} \right) \right\} \quad \cdots (12)$$

Fig. 13

$$T_w = T_h + q_p \cdot (R_{th} \cdot A + R_{thc} \cdot A) \quad \cdots (13)$$

SEASONING METHOD AND PLASMA PROCESSING APPARATUS

CROSS-REFERENCE TO RELATED APPLICATION

The present application claims priority under 35 U.S.C. § 119 to Japanese Patent Application No. 2022-117515 filed on Jul. 22, 2022 and Japanese Patent Application No. 2023-102510 filed on Jun. 22, 2023, the entire contents of which are incorporated herein by reference.

BACKGROUND

Field

Exemplary embodiments of the present disclosure relate to a seasoning method and a plasma processing apparatus.

Description of Related Art

Japanese Patent Application Laid-Open No. 2010-147052 discloses a technique for detecting moisture amount in a processing chamber.

SUMMARY

In one exemplary embodiment, a seasoning method implemented in a plasma processing apparatus is provided. The plasma processing apparatus comprises a chamber and an electrostatic chuck, the electrostatic chuck including a central region which supports a substrate and an annular region which surrounds the central region and supports a ring assembly, the seasoning method includes: disposing the ring assembly on the annular region of the electrostatic chuck; disposing the substrate on the central region of the electrostatic chuck; forming a plasma in the chamber; calculating a thermal resistance between the electrostatic chuck and the ring assembly; and determining, based on the calculated thermal resistance, whether to repeat the forming the plasma and the calculating the thermal resistance.

BRIEF DESCRIPTION OF DRAWINGS

FIG. 4 shows an example of a cross-section of the substrate support 11.

FIG. 11 shows examples of equations used in this processing method.

FIG. 12 shows an example of an equation used in this processing method.

FIG. 13 shows an example of an equation used in this processing method.

DETAILED DESCRIPTION

Figure 1:
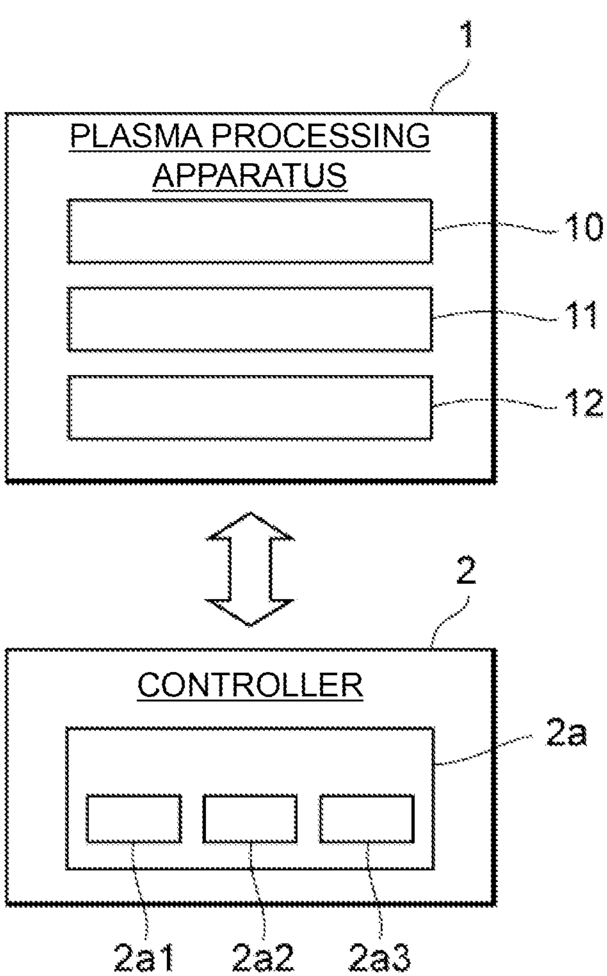
FIG. 1 illustrates an example configuration of a plasma processing system.

Hereinafter, each embodiment of the present disclosure will be described.

In one exemplary embodiment, a seasoning method implemented in a plasma processing apparatus is provided. The plasma processing apparatus comprises a chamber and an electrostatic chuck, the electrostatic chuck including a central region which supports a substrate and an annular region which surrounds the central region and supports a ring assembly, the seasoning method includes: disposing the ring assembly on the annular region of the electrostatic chuck; disposing the substrate on the central region of the electrostatic chuck; forming a plasma in the chamber; calculating a thermal resistance between the electrostatic chuck and the ring assembly; and determining, based on the calculated thermal resistance, whether to repeat the forming the plasma and the calculating the thermal resistance.

In one exemplary embodiment, the seasoning method further includes: repeating the forming the plasma and the calculating thermal resistance, based on a determination result in the determining whether to repeat; wherein the determining whether to repeat includes determining whether to further repeat the forming the plasma and the calculating the thermal resistance, based on a plurality of the thermal resistances calculated by repeating the forming the plasma and the calculating the thermal resistance.

In one exemplary embodiment, the seasoning method further includes: controlling supply power supplied to at least one heater so that a temperature of the at least one heater reaches setting temperature, the at least one heater being disposed in the electrostatic chuck; and measuring supply power supplied to the at least one of the heaters with a plasma being formed in the chamber; wherein in the calculating the thermal resistance, the thermal resistance is calculated based on the supply power measured with the plasma being formed in the chamber.

In one exemplary embodiment, the seasoning method further includes: measuring supply power supplied to the at least one heater with no plasma being formed in the chamber; wherein in the calculating the thermal resistance, the thermal resistance is calculated further based on the supply power measured with no plasma being formed in the chamber.

In one exemplary embodiment, in the calculating the thermal resistance, the thermal resistance is calculated based on an equation expressing a relationship among (a) an amount of heat transferred from the plasm to the ring assembly, (b) the thermal resistance between the ring assembly and the at least one heater and (c) the supply power supplied to the at least one heater with the plasma being formed in the chamber.

In one exemplary embodiment, with the plasma being formed in the chamber, a temperature of the ring assembly changes over time by a thermal flux generated between the plasma and the ring assembly.

In one exemplary embodiment, the seasoning method further includes: transferring with a transfer device, the ring assembly from outside the chamber to inside the chamber;

and disposing with the transfer device, the ring assembly on at least partially on the electrostatic chuck.

In one exemplary embodiment, a plasma processing apparatus is provided. The plasma processing apparatus comprises: a chamber; an electrostatic chuck disposed in the chamber; and a controller, the electrostatic chuck including a central region which supports a substrate and an annular region which surrounds the central region and supports a ring assembly, wherein the controller executes controls of: disposing the ring assembly on the annular region of the electrostatic chuck; disposing the substrate on the central region of the electrostatic chuck; forming a plasma in the chamber; calculating a thermal resistance between the electrostatic chuck and the ring assembly; and determining, based on the calculated thermal resistance, whether to repeat the forming the plasma and the calculating the thermal resistance.

Hereinafter, each embodiment of the present disclosure will be described in detail with reference to the drawings. In each drawing, the same or similar elements will be given the same reference numerals, and repeated descriptions will be omitted. Unless otherwise specified, a positional relationship such as up, down, left, and right will be described based on a positional relationship illustrated in the drawings. A dimensional ratio in the drawings does not indicate an actual ratio, and the actual ratio is not limited to the ratio illustrated in the drawings.

FIG. 1 is a view for explaining an example of a configuration of a capacitively-coupled plasma processing system. In one embodiment, the plasma processing system includes a plasma processing apparatus 1 and a controller 2. The plasma processing system is an example of a substrate processing system and the plasma processing apparatus 1 is an example of a substrate processing apparatus. The plasma processing apparatus 1 includes a plasma processing chamber 10, a substrate support 11 and a plasma generator 12. The plasma processing chamber 10 has a plasma processing space. Further, the plasma processing chamber 10 has at least one gas supply port for supplying at least one processing gas into the plasma processing space, and at least one gas exhaust port for exhausting the gas from the plasma processing space. The gas supply port is connected the gas supply 20 to be described below, and the gas exhaust port is connected to the exhaust system 40 to be described below. The substrate support 11 is disposed in the plasma processing space and has a substrate support surface for supporting a substrate.

The plasma generator 12 is configured to generate plasma from at least one processing gas supplied into the plasma processing space. The plasma formed in the plasma processing space may be Capacitive Coupled Plasma (CCP), Inductively Coupled Plasma (ICP), Electron-Cyclotron-resonance (ECR) plasma, Helicon Wave Plasma (HWP) or Surface Wave Plasma (SWP). Further, various types of plasma generator including Alternative Current (AC) plasma generator and Direct Current (DC) plasma generator may be used. In one embodiment, an AC signal (AC power) used in the AC plasma generator may have a frequency in the range of 100 kHz to 10 GHz. Accordingly, an AC signal may include Radio Frequency (RF) signal and Microwave signal. In one embodiment, an RF signal may have a frequency in the range of 100 kHz to 150 MHz.

The controller 2 processes computer-executable instructions for instructing the plasma processing apparatus 1 to execute various steps described herein below. The controller 2 may be configured to control the respective components of the plasma processing apparatus 1 to execute the various steps described herein below. In an embodiment, part or all of the controller 2 may be included in the plasma processing apparatus 1. The controller 2 may include a processor **2*a*1, a storage unit 2*a*2, and a communication interface 2*a*3. The controller 2 is implemented by, for example, a computer 2*a*. The processor 2*a*1 may be configured to read a program from the storage unit 2*a*2 and perform various control operations by executing the read program. The program may be stored in advance in the storage unit 2*a*2, or may be acquired via a medium when necessary. The acquired program is stored in the storage unit 2*a*2, and is read from the storage unit 2*a*2 and executed by the processor 2*a*1. The medium may be various storing media readable by the computer 2*a*, or may be a communication line connected to the communication interface 2*a*3. The processor 2*a*1 may be a Central Processing Unit (CPU). The storage 2*a*2 may include a random access memory (RAM), a read only memory (ROM), a hard disk drive (HDD), a solid state drive (SSD), or a combination thereof. The communication interface 2*a*3 may communicate with the plasma processing apparatus 1** via a communication line such as a local area network (LAN).

Figure 2A:
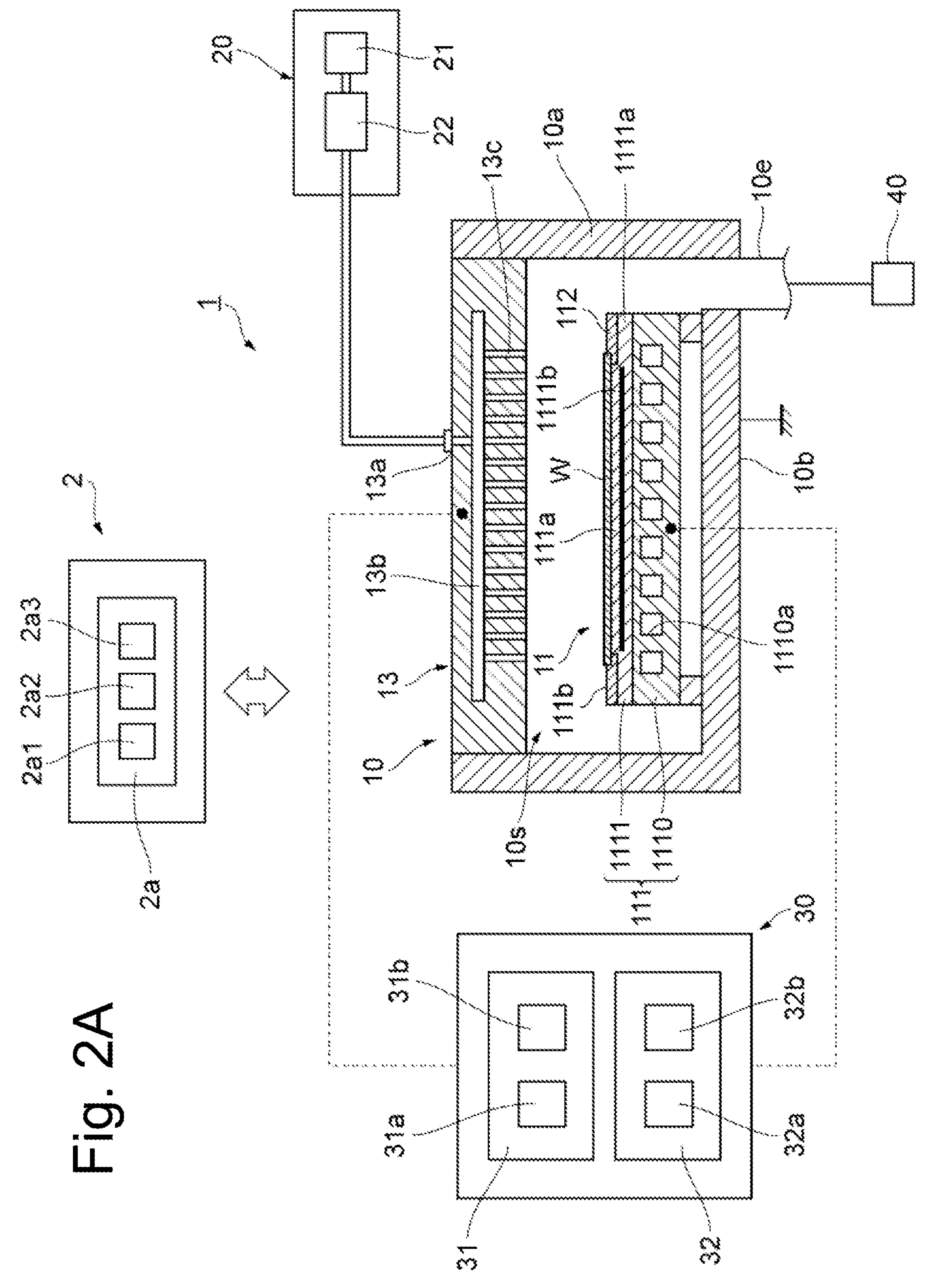
FIG. 2A illustrates an example configuration of a capacitively coupled plasma processing apparatus.
Figure 2B:
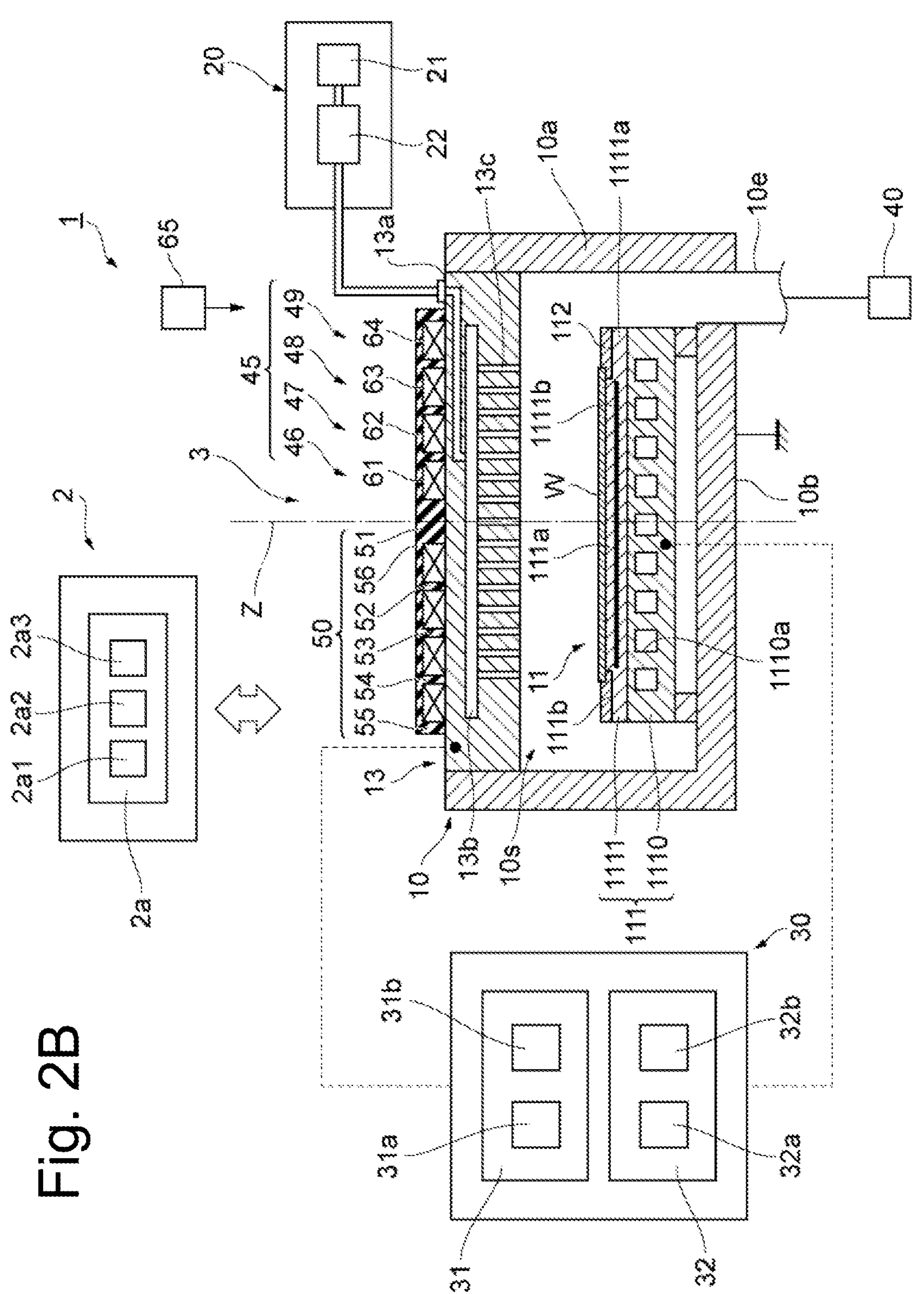
FIG. 2B illustrates an example configuration of a capacitively coupled plasma processing apparatus.

Hereinafter, an example of the configuration example of a plasma processing apparatus will be described. FIGS. 2A and 2B are views for explaining an example of a configuration of a capacitively-coupled plasma processing apparatus.

The capacitively-coupled plasma processing apparatus 1 includes a plasma processing chamber 10, a gas supply 20, a power source 30, and an exhaust system 40. Further, the plasma processing apparatus 1 includes a substrate support 11 and a gas introduction unit. The gas introduction unit is configured to introduce at least one processing gas into the plasma processing chamber 10. The gas introduction unit includes a shower head 13. The substrate support 11 is disposed in the plasma processing chamber 10. The shower head 13 is disposed above the substrate support 11. In one embodiment, the shower head 13 constitutes at least a part of a ceiling of the plasma processing chamber 10. The plasma processing chamber 10 has a plasma processing space **10*s* defined by the shower head 13, a sidewall 10*a* of the plasma processing chamber 10, and the substrate support 11. The plasma processing chamber 10 is grounded. The shower head 13 and the substrate support 11 are electrically insulated from a housing of the plasma processing chamber 10**.

The substrate support 11 includes a main body 111 and a ring assembly 112. The main body portion 111 has a central region **111*a* for supporting the substrate W and an annular region 111*b* for supporting the ring assembly 112. The wafer is an example of the substrate W. The annular region 111*b* of the main body 111 surrounds the central region 111*a* of the main body 111 in a plan view. The substrate W is disposed on the central region 111*a* of the main body 111 and the ring assembly 112 is disposed on the annular region 111*b* of the main body 111 to surround the substrate W on the central region 111*a* of the main body 111. Accordingly, the central region 111*a* is also referred to as a substrate support surface for supporting the substrate W, and the annular region 111*b* is also referred to as a ring support surface for supporting the ring assembly 112**.

In one embodiment, the main body 111 includes a base 1110 and an electrostatic chuck 1111. The base 1110 includes a conductive member. The conductive member of the base 1110 functions as a lower electrode. The electrostatic chuck 1111 is disposed on the base 1110. The electrostatic chuck 1111 includes a ceramic member **1111*a* and an electrostatic electrode 1111***b* disposed in the ceramic member 1111*a*. The ceramic member 1111*a* has a central region 111*a*. In one embodiment, the ceramic member 1111*a* also has an annular region 111*b*. Other members that surround the electrostatic chuck 1111, such as an annular electrostatic chuck and an annular insulating member, may have the annular region 111*b*. In this case, the ring assembly 112 may be disposed on the annular electrostatic chuck or the annular insulating member, or may be disposed on both the electrostatic chuck 1111 and the annular insulating member. Further, at least one RF/DC electrode coupled to a radio frequency (RF) power source 31 and/or a direct current (DC) power source 32 to be described below may be disposed inside the ceramic member 1111*a*. In this case, at least one RF/DC electrode functions as the lower electrode. In a case where the bias RF signal and/or the DC signal to be described later are supplied to at least one RF/DC electrode, the RF/DC electrode is also referred to as a bias electrode. The conductive member of the base 1110 and at least one RF/DC electrode may function as a plurality of lower electrodes. Further, the electrostatic electrode 1111*b* may function as the lower electrode. Accordingly, the substrate support 11 includes at least one lower electrode.

The ring assembly 112 includes one or more annular members. In one embodiment, one or more annular members include one or more edge rings and at least one cover ring. The edge ring is formed of a conductive material or an insulating material, and the cover ring is formed of an insulating material.

Further, the substrate support 11 may include a temperature control module configured to adjust at least one of the electrostatic chuck 1111, the ring assembly 112, and the substrate to a target temperature. The temperature control module may include a heater, a heat transfer medium, a flow path 1110*a*, or a combination thereof. A heat transfer fluid, such as brine or gas, flows through the flow path 1110*a*. In one embodiment, the flow path 1110*a* is formed inside the base 1110, and one or more heaters are disposed in the ceramic member 1111*a* of the electrostatic chuck 1111. Further, the substrate support 11 may include a heat transfer gas supply configured to supply a heat transfer gas to a gap between the rear surface of the substrate W and the central region 111*a*. The detail of the temperature control module is described in FIG. 4.

The shower head 13 is configured to introduce at least one processing gas from the gas supply 20 into the plasma processing space 10*s*. The shower head 13 has at least one gas supply port 13*a*, at least one gas diffusion chamber 13*b*, and a plurality of gas introduction ports 13*c*. The processing gas supplied to the gas supply port 13*a* passes through the gas diffusion chamber 13*b* and is introduced into the plasma processing space 10*s* from the plurality of gas introduction ports 13*c*. Further, the shower head 13 includes at least one upper electrode. The gas introduction unit may include, in addition to the shower head 13, one or a plurality of side gas injectors (SGI) that are attached to one or a plurality of openings formed in the sidewall 10*a*.

The gas supply 20 may include at least one gas source 21 and at least one flow rate controller 22. In one embodiment, the gas supply 20 is configured to supply at least one processing gas from the respective corresponding gas sources 21 to the shower head 13 via the respective corresponding flow rate controllers 22. Each flow rate controller 22 may include, for example, a mass flow controller or a pressure-controlled flow rate controller. Further, the gas supply 20 may include at least one flow rate modulation devices that modulate or pulse flow rates of at least one processing gas.

The power source 30 includes an RF power source 31 coupled to plasma processing chamber 10 via at least one impedance matching circuit. The RF power source 31 is configured to supply at least one RF signal (RF power) to at least one lower electrode and/or at least one upper electrode. As a result, plasma is formed from at least one processing gas supplied into the plasma processing space 10*s*. Accordingly, the RF power source 31 may function as at least a portion of the plasma generator 12. Further, by supplying the bias RF signal (bias signal) to the at least one lower electrode, a bias potential (bias power) is generated in the substrate W, making it possible to draw ion components in the formed plasma into the substrate W.

In one embodiment, the RF power source 31 includes a first RF generator 31*a* and a second RF generator 31*b*. The first RF generator 31*a* is configured to be coupled to at least one lower electrode and/or at least one upper electrode via at least one impedance matching circuit to generate a source RF signal (source RF power) for plasma generation. In one embodiment, the source RF signal has a frequency in the range of 10 MHz to 150 MHz. In one embodiment, the first RF generator 31*a* may be configured to generate a plurality of source RF signals having different frequencies. The generated one or more source RF signals are supplied to at least one lower electrode and/or at least one upper electrode.

The second RF generator 31*b* is configured to be coupled to at least one lower electrode via at least one impedance matching circuit to generate the bias RF signal (bias RF power). A frequency of the bias RF signal may be the same as or different from a frequency of the source RF signal. In one embodiment, the bias RF signal has a lower frequency than the frequency of the source RF signal. In one embodiment, the bias RF signal has a frequency in the range of 100 kHz to 60 MHz. In one embodiment, the second RF generator 31*b* may be configured to generate a plurality of bias RF signals having different frequencies. The generated one or more bias RF signals are supplied to at least one lower electrode. Further, in various embodiments, at least one of the source RF signal and the bias RF signal may be pulsed.

Further, the power source 30 may include a DC power source 32 coupled to the plasma processing chamber 10. The DC power source 32 includes a first DC generator 32*a* and a second DC generator 32*b*. In one embodiment, the first DC generator 32*a* is configured to be connected to at least one lower electrode to generate the first DC signal. The generated first DC signal is applied to at least one lower electrode. In one embodiment, the second DC generator 32*b* is configured to be connected to at least one upper electrode to generate a second DC signal. The generated second DC signal is applied to at least one upper electrode.

In various embodiments, at least one of the first and second DC signals may be pulsed. In this case, the sequence of voltage pulses is applied to at least one lower electrode and/or at least one upper electrode. The voltage pulse may have a pulse waveform of a rectangle, a trapezoid, a triangle or a combination thereof. In one embodiment, a waveform generator for generating a sequence of voltage pulses from the DC signal is connected between the first DC generator 32*a* and at least one lower electrode. Accordingly, the first DC generator 32*a* and the waveform generator configure a voltage pulse generator. In a case where the second DC generator 32*b* and the waveform generator configure the voltage pulse generator, the voltage pulse generator is connected to at least one upper electrode. The voltage pulse may have a positive polarity or a negative polarity. Further, the sequence of the voltage pulses may include one or more positive voltage pulses and one or more negative voltage pulses in one cycle. The first and second DC generators 32*a* and 32*b* may be provided in addition to the RF power source 31, and the first DC generator 32*a* may be provided instead of the second RF generator 31*b*.

The exhaust system 40 may be connected to, for example, a gas exhaust port 10*e* disposed at a bottom portion of the plasma processing chamber 10. The exhaust system 40 may include a pressure adjusting valve and a vacuum pump. The pressure in the plasma processing space 10*s* is adjusted by the pressure adjusting valve. The vacuum pump may include a turbo molecular pump, a dry pump, or a combination thereof.

The plasma processing apparatus 1 has an electromagnet assembly 3 including one or more electromagnets 45. The electromagnet assembly 3 is configured to generate a magnetic field in the chamber 10. In one embodiment, the plasma processing apparatus 1 comprises an electromagnet assembly 3 including a plurality of electromagnets 45. In the embodiment shown in FIG. 2*a* and/or FIG. 2*b*, the plurality of electromagnets 45 includes electromagnets 46-49. The plurality of electromagnets 45 are provided on or above the chamber 10. In other words, the electromagnet assembly 3 is located above or on top of the chamber 10. In the example shown in FIG. 2*a* and/or FIG. 2*b*, the plurality of electromagnets 45 are located on the shower head 13.

Each of the one or more electromagnets 45 includes a coil. In the example shown in FIG. 2*a* and/or FIG. 2*b*, electromagnets 46-49 include coils 61-64. The coils 61-64 are wound around a central axis Z. The central axis Z can be an axis passing through the center of the substrate W or the substrate support 11. In other words, in electromagnet assembly 3, the coils 61-61 can be cyclic coils. The coils 61-64 are coaxial about the central axis Z at the same height position.

The electromagnet assembly 3 further includes a bobbin 50 (or yoke). The coils 61-64 are wound around the bobbin 50 (or yoke). The bobbin 50 is formed, for example, from a magnetic material. The bobbin 50 has a columnar portion 51, a plurality of cylindrical portions 52-55, and a base portion 56. The base portion 56 has an approximate disk shape and its central axis line coincides with the central axis line Z. The columnar portion 51 and the plurality of cylindrical portions 52-55 extend downwardly from a lower surface of the base portion 56. The columnar portion 51 has an approximate cylindrical shape and its central axis line is coincident with the central axis line Z. The radius of the columnar portion 51 is, for example, 30 mm. The cylindrical portions 52-55 extend outside the columnar portion 51 in the radial direction with respect to the central axis line Z.

The coil 61 is wound along the outer circumference of the columnar portion 51 and is housed in the groove between the columnar portion 51 and the cylindrical portion 52. The coil 62 is wound along the outer circumference of the cylindrical portion 52 and is housed in the groove between the cylindrical portion 52 and the cylindrical portion 53. The coil 63 is wound along the outer circumference of the cylindrical portion 53 and is housed in the groove between the cylindrical portion 53 and the cylindrical portion 54. The coil 64 is wound along the outer circumference of the cylindrical portion 54 and is housed in the groove between the cylindrical portion 54 and the cylindrical portion 55.

A current source 65 is connected to each coil included in the one or more electromagnets 45. The supplying and stopping of the current, the direction of the current, and the value of the current from the current source 65 to each coil included in the one or more electromagnets 45 are controlled by the control unit 2. In addition, if the plasma processing apparatus 1 comprises a plurality of the electromagnets 45, the coils of the plurality of the electromagnets 45 may be connected to a single current source or may be connected to different current sources, respectively, from each other.

The one or more electromagnets 45 form a magnetic field in the chamber 10 that is axisymmetric with respect to the central axis line Z. By controlling the current supplied to each of the one or more electromagnets 45, it is possible to adjust the intensity distribution (or the magnetic flux density) of the magnetic field in the radial direction with respect to the central axis line Z. This allows the plasma processing apparatus 1 to adjust the radial distribution of the density of the plasma formed in the chamber 10.

Figure 3:
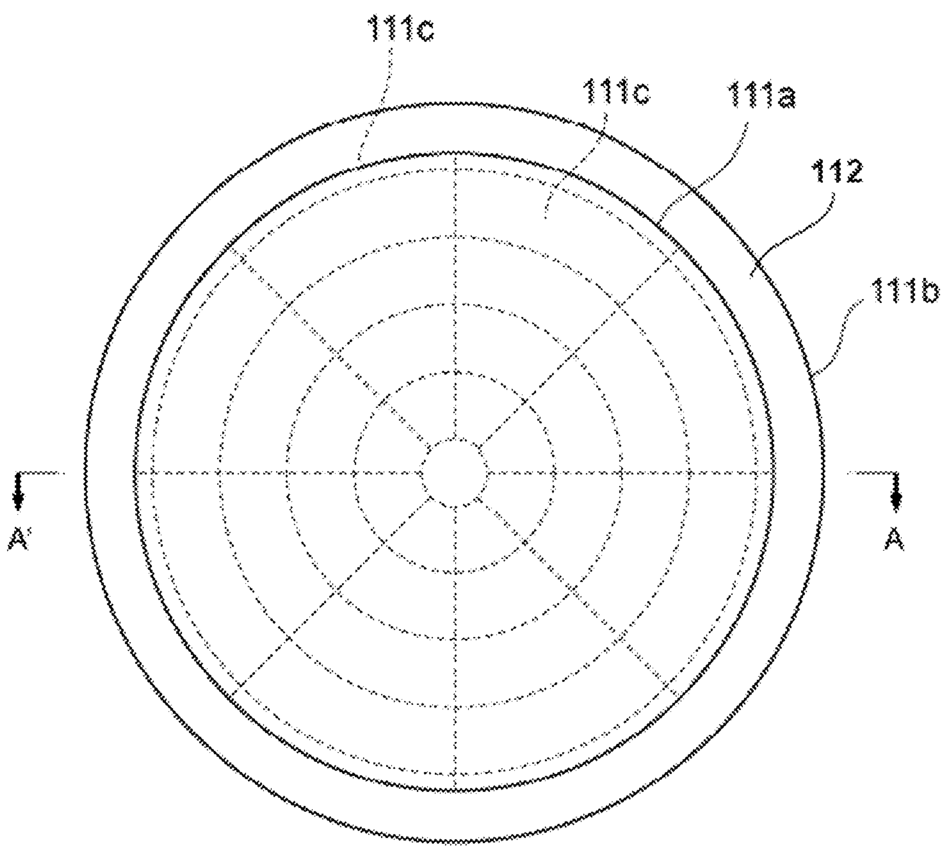
FIG. 3 shows an example of the top surface of the substrate support unit 11.

FIG. 3 shows an example of a top surface of the substrate support 11. As shown in FIG. 3, the substrate support 11 includes a central region 111*a* for supporting the substrate W and an annular region 111*b* for supporting the ring assembly 112. The central region 111*a* includes a plurality of zones 111*c*, as shown by dashed lines in FIG. 3. In this embodiment, the temperature control module can control the temperature of the substrate W or the substrate support 111*c* on a zone 111*c* basis. The number of zones 111*c* and the area and shape of each zone 111*c* may be set according to the conditions required in the temperature control of the substrate W.

Figure 4:
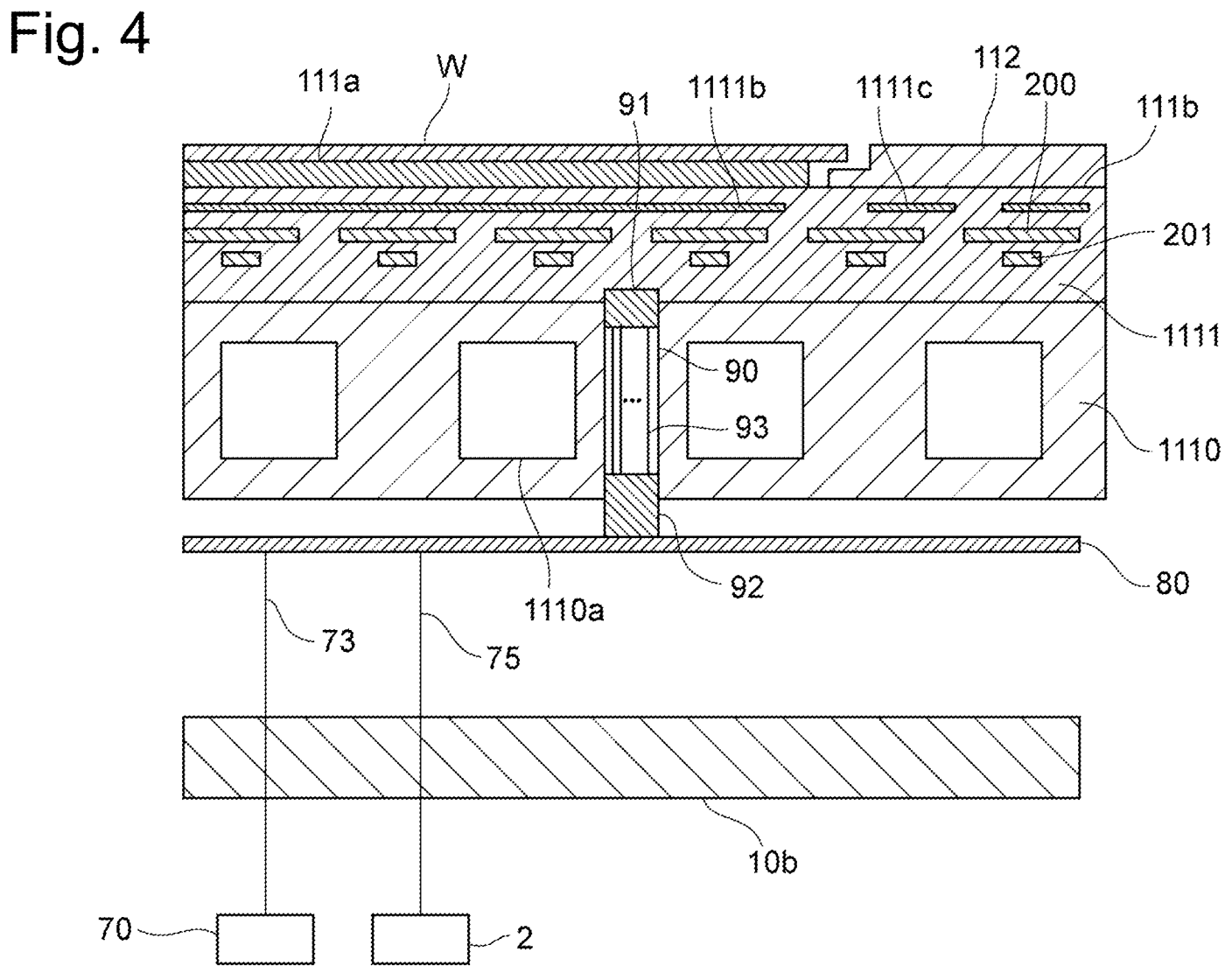

FIG. 4 shows an example of a cross-section of the substrate support 11. FIG. 4 shows a portion of the cross-section of the substrate support 11 at AA in FIG. 3. As shown in FIG. 4, the substrate support 11 has the electrostatic chuck 1111, the base 1110, and the control substrate 80. The electrostatic chuck 1111 has a plurality of heaters 200 and a plurality of resistive elements 201 inside the electrostatic chuck 1111. In this embodiment, in each zone 111*c* shown in FIGS. 2*a* and 2*b*, one heater 200 and one resistive element 201 are located inside the electrostatic chuck 1111. In each zone 111*c*, the resistive element 201 is disposed near the heater 200. In one example, the resistive element 201 can be positioned between the heater 200 and the base 1110 and closer to the heater 200 than the base 1110. The resistive element 201 is configured such that its resistance varies with temperature. In one example, the resistive element 201 can be a thermistor.

The ring assembly 112 is disposed in the annular region 111*b* of the electrostatic chuck 111. In the inside of the electrostatic chuck 11111, a plurality of heaters 200 and a plurality of resistive elements 201 are disposed from the central region 111*a* to the annular region 111*b*. The electrostatic chuck 1111 can also have one or more electrostatic electrodes 1111*c*. As an example, the electrostatic electrode 1111*c* has two electrostatic electrodes 1111*c*. As shown in FIG. 4, one of the two electrostatic electrodes 1111*c* can be disposed in the inner region in the annular region 111*b* and the other in the outer region. The two electrostatic electrodes 1111*c* can comprise bipolar electrodes. A DC voltage can be applied to the two electrostatic electrodes 1111*c* to generate a potential difference between the two electrostatic electrodes 1111*c*. When a potential difference is generated between the two electrostatic electrodes 1111*c*, an electrostatic attractive force is generated between the annular region 111*b* and the ring assembly 112. The ring assembly 112 is attracted to the annular region 111*b* and held in the annular region 111*b* by the generated electrostatic attractive force.

The base 1110 has one or more through holes 90 that pass through the base 1110 from its top surface (the surface facing the electrostatic chuck 1111) to its bottom surface (the surface facing the control substrate 80). The plurality of heaters 200 and the plurality of resistive elements 201 can be electrically connected to the control board 80 through the through-holes 90. In this embodiment, a connector 91 is fitted at one end of the upper side of the through hole 90, and a connector 92 is fitted at one end of the lower side of the through hole 90. The plurality of heaters 200 and the plurality of resistive elements 201 are electrically connected to the connector 91. The plurality of heaters 200 and the plurality of resistive elements 201 may be connected to the connector 91, for example, via wiring arranged inside the electrostatic chuck 1111. The connector 92 is electrically connected to the control board 80. In the through hole 90, a plurality of wires 93 are arranged to electrically connect the connector 91 and the connector 92. Thereby, the plurality of heaters 200 and the plurality of resistive elements 201 can be electrically connected to the control board 80 via the through hole 90. The connector 92 may function as a support member to secure the control board 80 to the base 1110.

The control board 80 is a board on which the elements controlling the plurality of heaters 200 and/or the plurality of resistive elements 201 are arranged. The control board 80 can be positioned facing the under the lower surface of the base 1110 and parallel to the lower surface. The control board 80 may be arranged surrounded by conductor members. The control board 80 may be supported by the base 1110 with a support member other than the connector 92.

The control board 80 can be electrically connected to the power supply unit 70 via the wiring 73. In other words, the power supply unit 70 can be electrically connected to the plurality of heaters 200 via the control board 80. The power supply unit 70 generates power that is supplied to the plurality of heaters 200. Thereby, the power supplied from the power supply unit 70 to the control board 80 can be supplied to the plurality of heaters 200 via the connector 92, the wiring 93, and the connector 91. An RF filter that reduces RF may be placed between the power supply 70 and the control board 80. The RF filter may be provided outside the plasma processing chamber 10.

The control board 80 can be communicably connected to the control unit 2 via wiring 75. The wiring 75 can be an optical fiber. In this case, the control board 80 communicates with the control unit 2 with optical communication. The wiring 75 can also be metal wiring.

Figure 5:
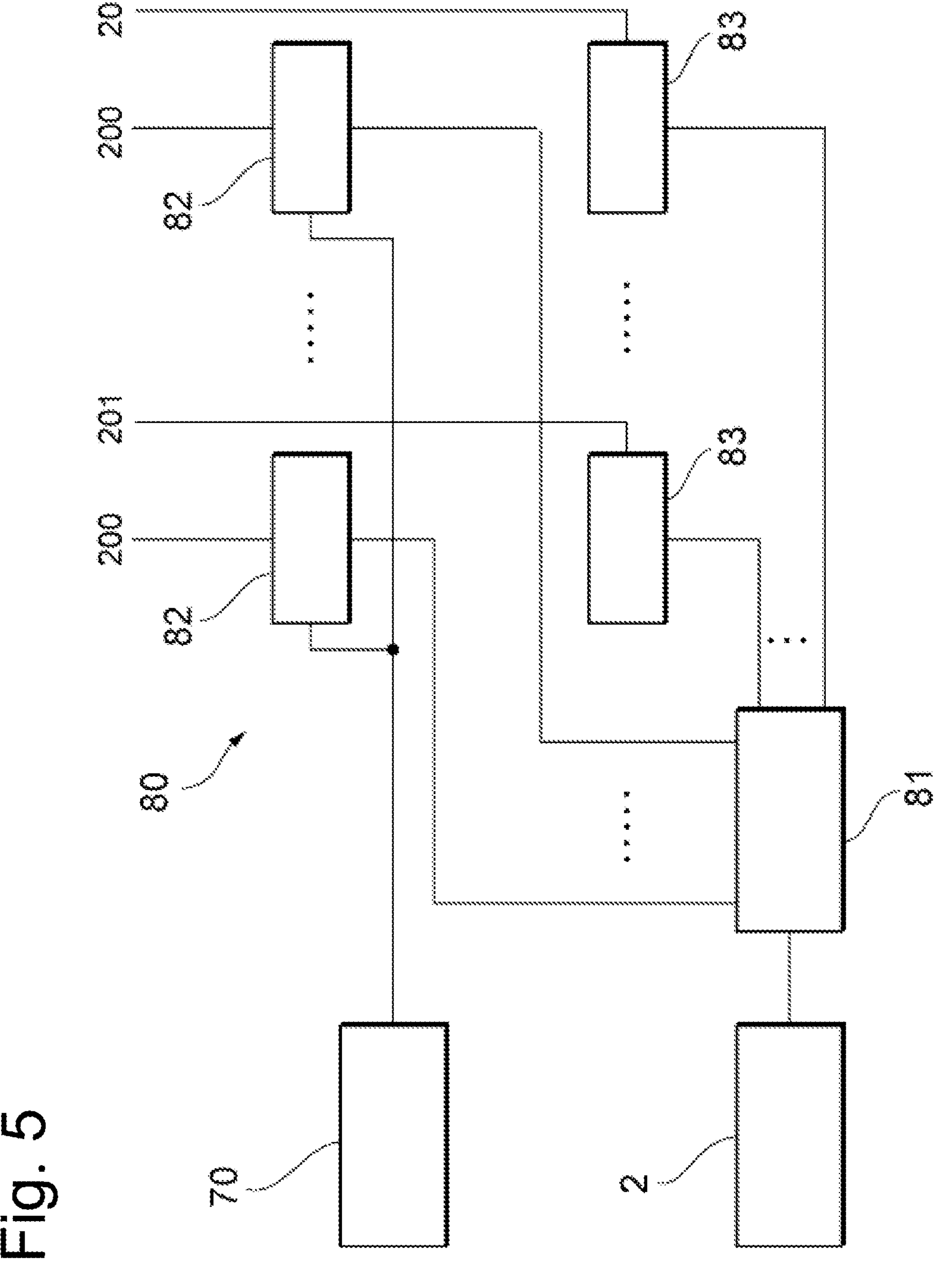
FIG. 5 shows a block diagram showing an example of the configuration of control board 80.

FIG. 5 is a block diagram showing an example of the configuration of the control board 80. The control board 80 has a control unit 81, a plurality of supply units 82 and a plurality of measurement units 83 as examples of elements. The plurality of supply sections 82 and the plurality of measurement units 83 are provided corresponding to the plurality of heaters 200 and the plurality of resistive elements 201, respectively. One supply unit 82 and one measurement unit 83 may be provided for one heater 200 and one resistive element 201.

Each measurement unit 83 generates a voltage based on the resistance value of each resistive element 201 provided corresponding to each measurement unit 83 and supplies the voltage to control unit 81. The measurement unit 83 may be configured to convert the voltage generated based on the resistance value of the resistive element 201 into a digital signal and output the digital signal to the control unit 81.

The control unit 81 controls the temperature of the substrate W in each zone 111*c*. The control unit 81 controls the power supply to the plurality of heaters 200 based on the set temperature received from the control unit 2 and the voltage indicated by the digital signal received from the measuring unit 83. As an example, the control unit 81 controls the temperature of the resistive element 201 (hereinafter also referred to as the "measured temperature") based on the voltage indicated by the digital signal received from the measurement unit 83. The temperature of the resistor 201 is calculated. The control unit 81 then controls each of the supply units 82 based on the set temperature and the measured temperature. Each supply unit 82 switches whether or not to supply power supplied from the power supply unit 70 to each of the heaters 200 based on the control of the control unit 81. Each supply unit 82 may increase or decrease the power supplied from the power supply unit 70 and supply the power to each of the heaters 200 based on the control of controller 81. This allows the substrate W, the electrostatic chuck 1111 and/or the base 1110 to be brought to a predetermined temperature.

<Configuration Example of a Substrate Processing System>

Figure 6:
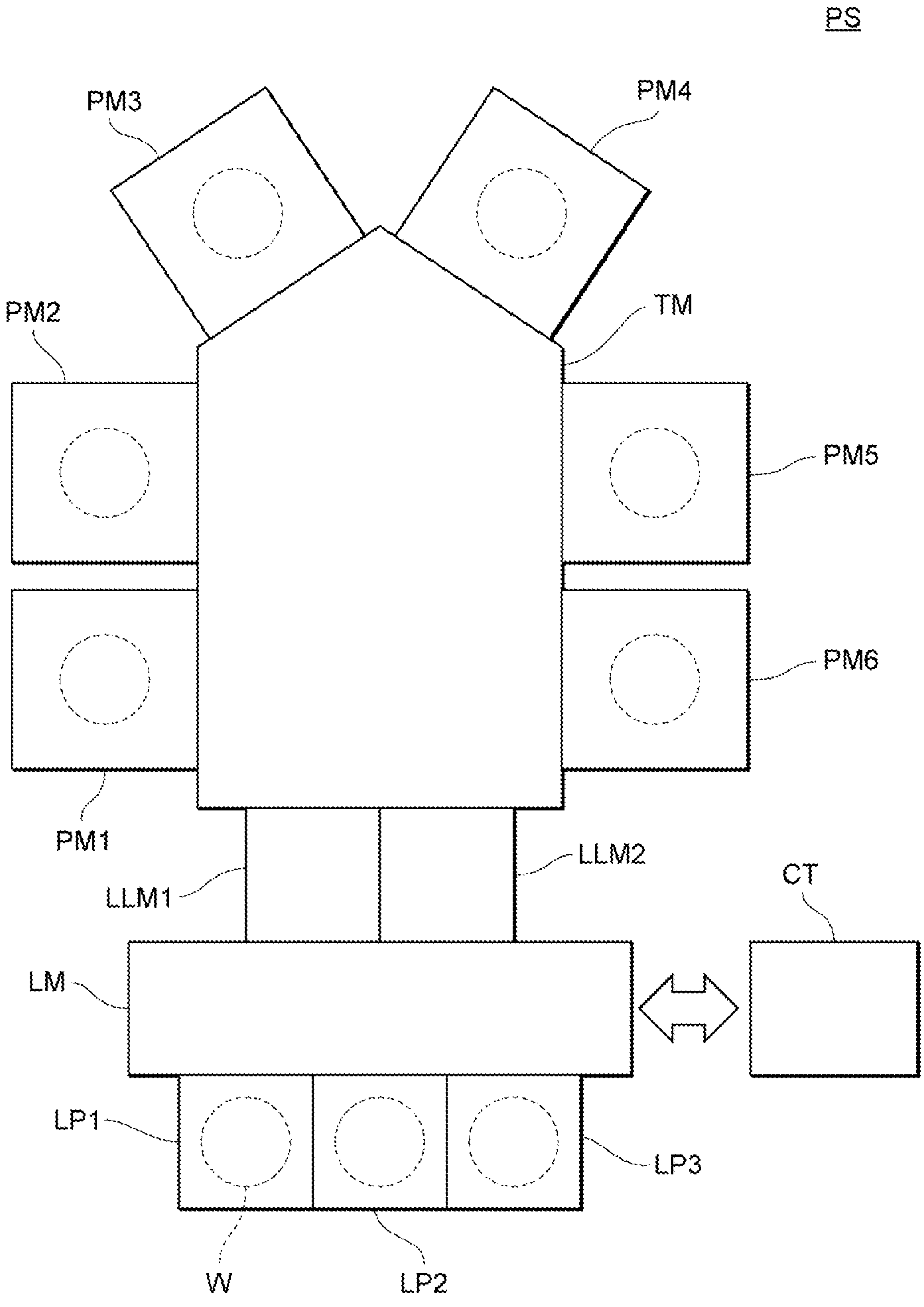
FIG. 6: illustrates an example configuration of a substrate processing system.

FIG. 6 illustrates an exemplary configuration of a substrate processing system. FIG. 6 shows a schematic of a substrate processing system (hereinafter referred to as "substrate processing system PS") for one exemplary embodiment.

The substrate processing system PS comprises substrate processing chambers PM1-PM6 (hereinafter collectively referred to as "substrate processing modules PM")), transfer module TM, load lock module LLM1 and LLM2 (hereinafter also collectively referred to as "load lock module LLM")), loader module LM, and load ports LP1 through LP3 (hereinafter also collectively referred to as "load port LP")). The controller CT controls each of the components of the substrate processing system PS to perform a given process on the substrate W.

The substrate processing module PM performs etching, trimming, deposition, annealing, doping, lithography, cleaning, ashing, and other processes on the substrate W in the substrate processing module PM. At least one of the substrate processing chambers PM1-PM6 may be the plasma processing apparatus 1 shown in FIG. 1, FIG. 2*a* or FIG. 2*b*. At least one of the substrate processing chambers PM1-PM6 may be a plasma processing apparatus using any plasma source, such as inductively coupled plasma or microwave plasma. At least one of the substrate processing chambers PM1-PM6 may be a measurement module, which may measure the thickness of a film formed on the substrate W and the dimensions of a pattern formed on the substrate W, for example, using optical methods.

The transfer module TM has a transfer device that transfers the substrate W between the substrate processing modules PM or between the substrate processing modules PM and the load lock module LLM. The substrate processing module PM and the load lock module LLM are arranged adjacent to the transfer module TM. The transfer module TM and the substrate processing module PM and the transfer module TM and the load lock module LLM are spatially isolated or connected by a gate valve that can be opened and closed.

In one embodiment, a transfer device included in a transfer module TM transfers the substrate W from the transfer module TM to the plasma processing space 10*s* of the plasma processing apparatus 1, which is an example of a substrate processing module PM. The transfer device places the substrate W on the central area 111*a* of the substrate support 11. The plasma processing apparatus 1 may comprise lifters, and said transport apparatus may place the substrate W on the lifters. The lifters are configured to be able to rise and fall inside a plurality of through holes provided in the substrate support 11. When the lifters rise, the tips of the lifters protrude from the central area 111*a* of the substrate support 11, and the substrate W is held in this position. When the lifters are lowered, the tips of the lifters are housed in the substrate support 11, and the substrate W is placed on the central area 111*a* of the substrate support 11. As an example, the transport device may be a handler that transfers substrates such as silicon wafers. In addition to the substrate W, the transfer device can also transfer the ring assembly 112 and place it on the electrostatic chuck 111. The substrate processing system PS may further comprise a module for storing the ring assembly 112 for replacement.

The load lock modules LLM1 and LLM2 are located between the transfer module TM and the loader module LM. The load lock module LLM can switch its internal pressure to atmospheric pressure or vacuum pressure. The "atmospheric pressure" can be the pressure outside of each module included in the substrate processing system PS. The "vacuum pressure" can be a pressure lower than atmospheric pressure, for example, a medium vacuum pressure of 0.1 Pa to 100 Pa. The load lock module LLM transfers the substrate W from the loader module LM, which is at atmospheric pressure, to the transfer module TM, which is at vacuum pressure, and from the transfer module TM, which is at vacuum pressure, to the loader module LM, which is at atmospheric pressure.

The loader module LM includes a transfer device to transfer substrates W between the load lock module LLM and the load board LP. A FOUP (Front Opening Unified Pod) or an empty FOUP that can hold, for example, 25 substrates W can be placed inside the load port LP. The loader module LM removes substrates W from the FOUP inside the load port LP and transfers them to the load lock module LLM. The loader module LM also removes substrates W from the load lock module LLM to transfer them to the FOUPs in the load board LP.

The controller CT controls each configuration of the substrate processing system PS to execute a given process to the substrate W. The control unit CT stores recipes in which process procedures, process conditions, transfer conditions, etc. are set, and controls each configuration of the substrate processing system PS to execute a given process on the substrate W according to said recipes. The controller CT may serve as part or all of the functions of the controller 2 shown in FIG. 1.

<Example of Seasoning Method

Figure 7:
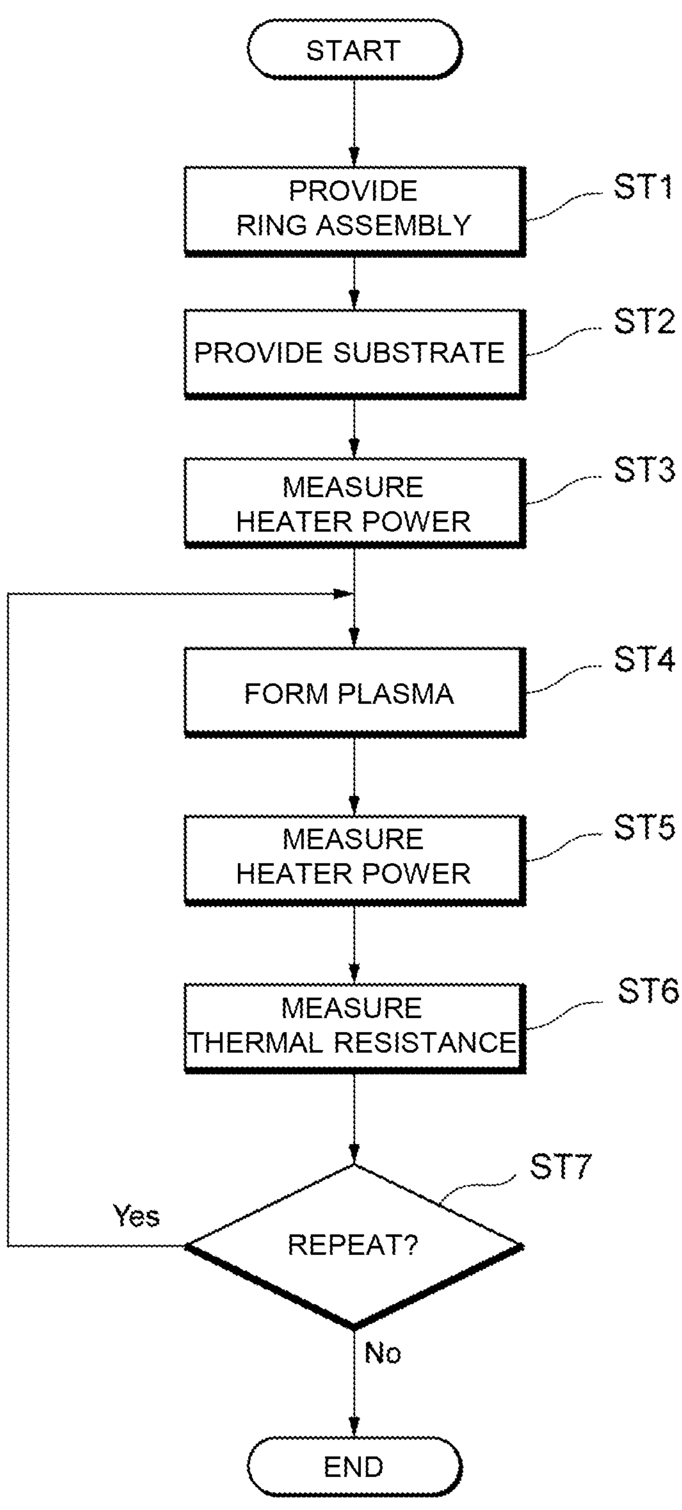
FIG. 7 shows a flowchart of a seasoning method according to one exemplary embodiment.

FIG. 7 shows a flowchart of one exemplary embodiment of a seasoning method (hereinafter referred to as "this processing method"). For example, when the ring assembly 112 is placed on the electrostatic chuck 1111 during replacement of the ring assembly 112, moisture may be present between the ring assembly 112 and the electrostatic chuck 1111. The presence of this moisture may prevent the ring assembly 112 from attracting well to the electrostatic chuck 1111. In order to remove the moisture present between the ring assembly 112 and the electrostatic chuck 1111, the ring assembly 112 placed in the chamber is seasoned. In this processing method, the end point of seasoning (the point at which moisture is considered to be almost removed) can be determined based on the thermal resistance between the ring assembly 112 and the electrostatic chuck 1111, which is correlated with the amount of moisture present between the ring assembly 112 and the electrostatic chuck 1111. In one example, the moisture may be determined to be almost removed when the thermal resistance reaches a predetermined value after performing this processing method.

As shown in FIG. 7, this processing method includes the steps of disposing the ring assembly on the electrostatic chuck 1111 (ST1), disposing the substrate W on the substrate support 11 (ST2), measuring the heater power with no plasma being formed (ST3), forming a plasma in the plasma processing chamber 10 (ST4), measuring the temperature of each heater 200 in the plasma processing chamber 10 with a plasma being formed (ST5), calculating the thermal resistance (ST6), and determining whether to repeat the steps ST4 to ST6 (ST7). The processing in each step may be performed by the plasma processing system shown in FIG. 1. In the following, as an example, the controller 2 controls each unit of the plasma processing apparatus 1 to perform this processing method.

(Step ST1: Disposition of Ring Assembly)

In step ST1, the ring assembly 112 is disposed on the electrostatic chuck 111. As an example, the ring assembly 112 can be transferred into the plasma processing chamber 10 from the transfer module TM by the transfer device of the transfer module TM. The ring assembly 112 can be disposed on the annular region 111*b* of the electrostatic chuck 111 after being transferred into the plasma processing chamber 10. A person can open the plasma processing chamber 10 and dispose the ring assembly 112 on the annular region 111*b* of the electrostatic chuck 111.

(Step ST2: Disposition of Substrate)

In step ST2, the substrate W is disposed on the substrate support 11. The substrate W can be transferred into the plasma processing chamber 10 from the transfer module TM by the transfer module TM transfer device. The substrate W can be disposed on the central area 111*a* (substrate support surface) of the electrostatic chuck 111 after being transferred into the plasma processing chamber 10. For example, the substrate W to be deposited on the substrate support 11 can be a dummy substrate, such as a silicon substrate.

The substrate W has a front surface and a back surface. In step ST2, the substrate W is disposed on the substrate support 11 so that the back surface of the substrate W contacts the substrate support surface of the electrostatic chuck 11. With the substrate W disposed on the substrate support 11, a gap can be formed between the back surface of the substrate W and the substrate support surface. The gap can be a groove formed on the substrate support surface of the substrate support 11. The grooves can be formed to have a predetermined pattern on the substrate support surface.

(Step ST3: Measurement of Heater Power)

In step ST3, the supply power supplied to the plurality of heaters 200 (hereinafter referred to as "heater power") is measured with no plasma being formed. As an example, in this processing method, from step ST3 to step ST5, the temperatures of the plurality of heaters 200 can be controlled so that the temperature of the substrate W and/or the ring assembly 112 is approximately constant at the set temperature. Then, in step ST3, the heater power supplied to the plurality of heaters 200 may be measured with the temperature of the substrate W and/or the ring assembly 112 being at the set temperature. In step ST3, the heater power supplied to one or more of the plurality of heaters 200 disposed between the ring assembly 112 and the base 1110 may be measured.

(Step ST4: Formation of Plasma)

In step ST4, plasma is formed. Specifically, in step ST4, the processing gas is supplied into the plasma processing chamber 10. In addition, a source RF signal is supplied to the upper electrode or the lower electrode. As a result, plasma is formed from the processing gas in the plasma processing chamber 10. An amount of heat according to the formed plasma is then supplied to the ring assembly 112 from the formed plasma.

(Process ST5: Measurement of Heater Power)

In step ST5, with the plasma being formed, the heater power supplied to the plurality of heaters 200 is measured. In step ST5, the temperature of the substrate W and/or the ring assembly 112 can change depending on the amount of heat transferred from the plasma to the substrate W and/or the ring assembly 112. In other words, the heater power measured at the plurality of heaters 200 can vary depending on the amount of heat transferred from the plasma to the substrate W and/or the ring assembly 112. In step ST5, the heater power supplied to one or more of the plurality of heaters 200 disposed between the ring assembly 112 and the base 1110 may be measured.

(Process ST6: Calculation of Thermal Resistance)

In step ST6, the thermal resistance between the ring assembly 112 and the electrostatic chuck 111 is calculated. The thermal resistance can be calculated based on the heater power measured in step ST3 and step ST5. An example of the method of calculating thermal resistance is described below with reference to FIGS. 8 and 9.

Figure 8:
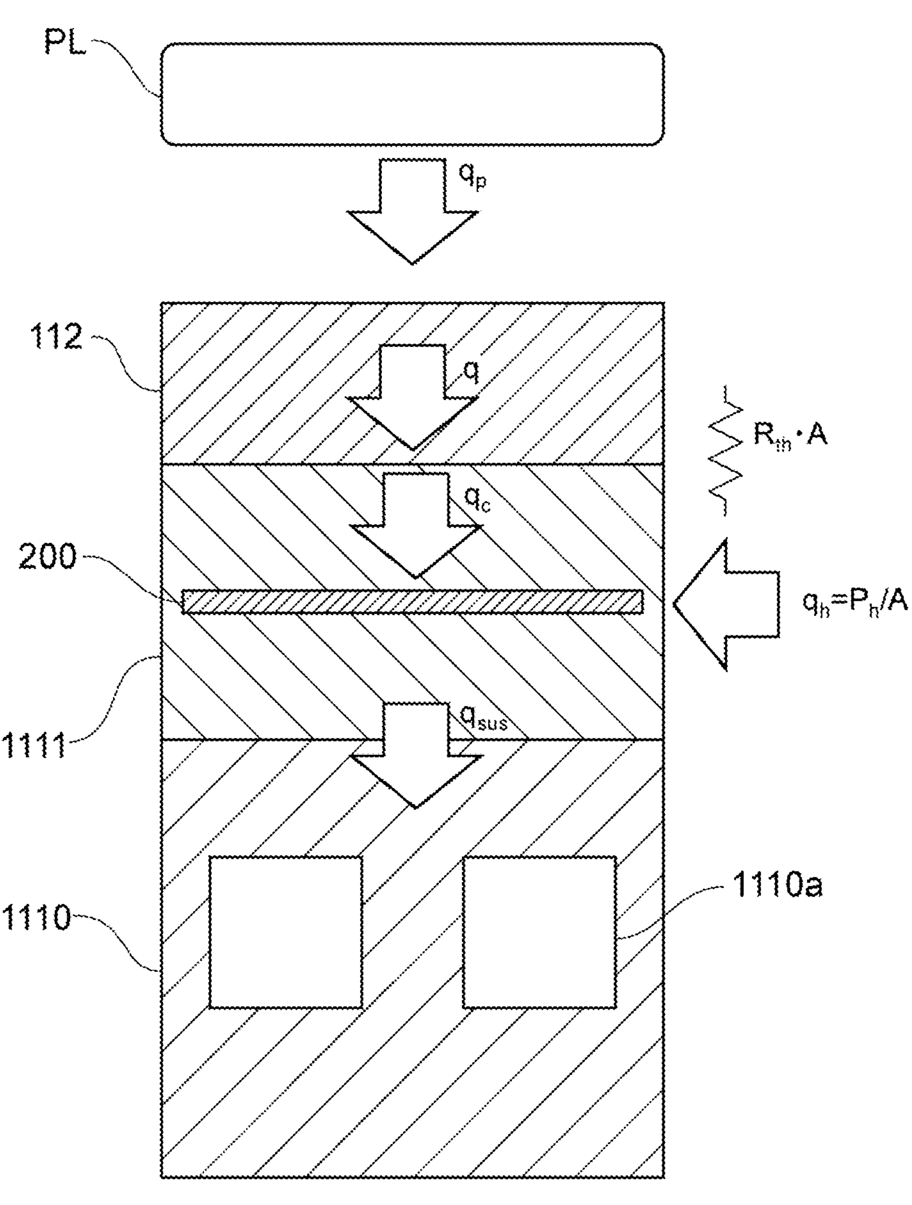
FIG. 8 shows a schematic diagram of energy flow.

FIG. 8 schematically illustrates the energy flow among the plasma PL, the ring assembly 112, the substrate support 11 and the base 1110. The example shown in FIG. 8 illustrates the energy flow in one zone 111*c* of the substrate support 11. The substrate support 11 includes the electrostatic chuck 1111 and the base 1110. Inside the electrostatic chuck 1111 the heater 200 is disposed. Inside the base 1110, a channel 1110*a* is formed through which the heat transfer medium flows.

The temperature of heater 200 can vary depending on the power supplied by the power supply unit 70. In FIG. 8, the power supplied to heater 200 is shown as heater power Ph. In the heater 200, a heat flux qh is generated in response to the heater power Ph. The heat flux qh is the amount of heat generation per unit area, which is the heater power Ph divided by the area A. The area A is the area of the heater 200 in the plan view of the ring assembly 112.

When the plasma PL is being formed in the plasma processing chamber 10, the temperature of the ring assembly 112 can increase due to the heat transferred from the plasma PL to the ring assembly 112. In FIG. 8, the heat flux qp from the plasma PL to the ring assembly 112 is shown as the heat flux per unit area, which is the amount of heat transferred from the plasma PL to the ring assembly 112 divided by the area of the ring assembly 112.

Heat transferred from the plasma PL to the ring assembly 112 is transferred from the ring assembly 112 to the electrostatic chuck 1111. In FIG. 8, the thermal resistance per unit area between the ring assembly 112 and the electrostatic chuck 111*c* is shown as thermal resistance Rth·A. Here, A is the area of the zone 111*c* where the heater 200 is located. Rth is the thermal resistance of the zone 111*c* where the heater 200 is located. The amount of heat per unit area transferred from the ring assembly 112 to the electrostatic chuck 111*c* is shown as heat flux q.

Heat transferred from the ring assembly 112 to the surface of the electrostatic chuck 1111 is transferred from the surface of the electrostatic chuck 1111 to the heater 200. In FIG. 8, the amount of heat per unit area transferred from the surface of the electrostatic chuck 1111 to the heater 200 is shown as heat flux qc.

The base 1110 is cooled by the heat transfer gas flowing through the channel 1110*a* to cool the electrostatic chuck 1111. In FIG. 7, the heat flux per unit area is shown as qsus, which is transferred from the back surface of the electrostatic chuck 1111 to the base 1110. This can change the temperature of the heater 200 depending on the amount of heat transferred from outside the heater 200 to the heater 200 and from the heater 200 to outside the heater 200. For example, in the example shown in FIG. 8, if qh+qc>qsus, the temperature of heater 200 can increase. If qh+qc<qsus, the temperature of heater 200 can decrease.

When the temperature of the heater 200 is controlled to be constant, the sum of the amount of heat transferred from outside the heater 200 to the heater 200 and the amount of heat generation at the heater 200 can be equal to the amount of heat transferred from the heater 200 to outside the heater 200. For example, when the temperature of heater 200 is controlled to be constant, the amount of heat generation by the heater 200 and the amount of heat transferred from the heater 200 to the base 1110 can be equal without the plasma PL being formed. In other words, in the example shown in FIG. 8, it can be assumed that qh=qsus.

On the other hand, when the temperature of the heater 200 is controlled to be constant, for example, with the plasma PL being formed, the sum of the amount of heat transferred from outside the heater 200 to the heater 200 and the amount of heat generation by the heater 200 is equal to the amount of heat transferred from the heater 200 to the outside of the heater 200. Here, there are two states in which plasma PL is generated: a transient state and a steady state. The transient state is, for example, the state where qp>q>qc. In other words, it is a state in which the temperatures of the ring assembly 112 and the electrostatic chuck 111 increases over time due to the heat flux qp (this state is also referred to as a "transient state"). On the other hand, the steady state is, for example, a state in which qp=q=qc. In other words, it is a state in which the temperatures of the ring assembly 112 and the electrostatic chuck 111 do not increase over time due to the heat flux qp (this state is also referred to as the "steady state").

Figure 9:
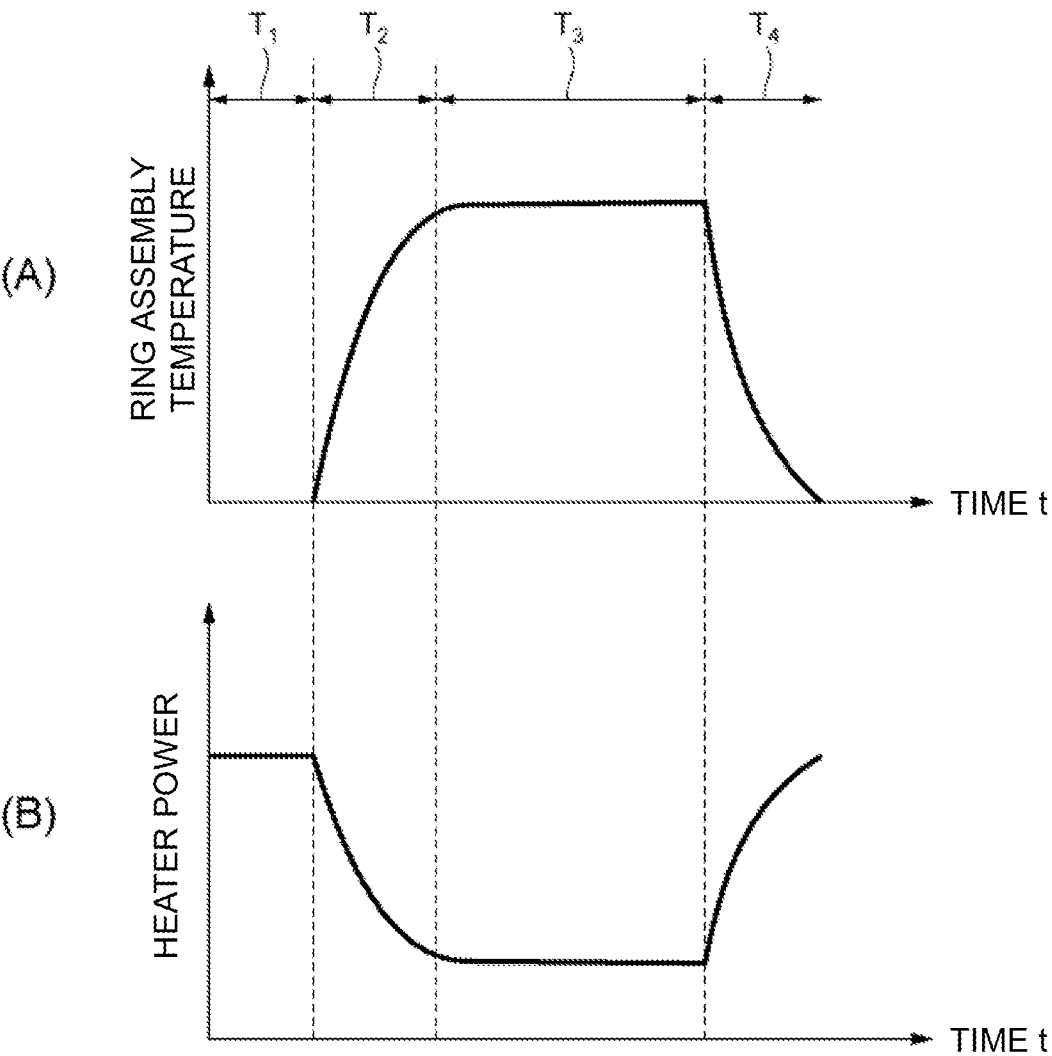
FIG. 9 shows an example of changes in the temperature of the ring assembly 112 and the power supplied to the heater 200.

FIG. 9 shows an example of changes in the temperature of the ring assembly 112 and the power supplied to the heater 200. (a) in FIG. 9 shows the change in temperature of the ring assembly 112. (b) in FIG. 9 shows the change in the power supplied to the heater 200. In the example shown in FIG. 9, the temperature of the heater 200 is controlled to be constant. The example shown in FIG. 9 shows an example of the results of measuring the power supplied to the heater 200 to calculate the temperature of the ring assembly 112 over the state in which no plasma is formed to the state in which plasma is formed.

Period T1 in FIG. 9 is the period during which no plasma is formed. In period T1, the power supplied to heater 200 can be constant. Period T2 in FIG. 9 is a period during which a plasma is formed and is a transient state. In period T2, the power supplied to the heater 200 decreases over time. Also, in period T2, the temperature of the ring assembly 112 increases over time. Period T3 in FIG. 9 is the period during which a plasma is formed. In period T3, a steady state is reached and the temperature of the ring assembly 112 becomes constant. In period T3, the power supplied to the heater 200 is also approximately constant. Period T4 in FIG. 9 is a period during which no plasma is formed. In period T4, since the heat transferred from the plasma to the ring assembly 112 is reduced or eliminated, the temperature of the ring assembly 112 decreases while the power supplied to the heater 200 is increased.

The tendency of decrease in the power supplied to the heater 200 during the transient state shown in period T2 in FIG. 9 can vary depending on the amount of heat transferred from the plasma to the ring assembly 112 and/or the thermal resistance between the ring assembly 112 and the surface of the electrostatic chuck 1111.

When the temperature of the heater 200 is controlled to be constant, the heater power Ph varies with the heat flux qp from the plasma PL to the ring assembly 112 and the thermal resistance Rth·W between the ring assembly 112 and the surface of the electrostatic chuck 1111. For example, if the heat flux qp from the plasma PL to the ring assembly 112 increases in the transient state, the heater power Ph supplied to the heater 200 can decrease because the heat flux qp can increase the temperature of the ring assembly 112.

When the temperature of the heater 200 is controlled to be constant, the change in the power supplied to the heater 200 in the transient state can be modeled as an expression for per unit area. For example, in the presence of the heat flux qp, the amount of heat qh per unit area of heater 200 can be expressed as in Equation (1). FIG. 11 shows Equations (1) to (11). FIG. 12 shows Equation (12). FIG. 13 shows Equations (13).

Where,

Ph is the heater power [W] in the presence of heat flux qp.

Ph0 is the heater power [W] without heat flux qp and in steady state.

qh is the amount of heat generation per unit area of the heater 200 [W/m2] when there is a heat flux qp.

qh0 is the amount of heat generation per unit area [W/m2] of the heater 200 when there is no heat flux qp and in steady state.

qp is the heat flux per unit area from the plasma PL to the ring assembly 112 [W/m2].

Rth·A is the thermal resistance per unit area between the ring assembly 112 and the surface of the electrostatic chuck 1111 [K·m2/W].

Rthc·A is the thermal resistance per unit area [K·m2/W] between the surface of the electrostatic chuck 1111 and the heater 200.

A is the area [m2] of the zone 111*c* where the heater 200 is provided.

ρw is the density of ring assembly 112 [kg/m3].

Cw is the heat capacity per unit area of the ring assembly 112 [J/K·m2].

zw is the thickness [m] of the ring assembly 112.

ρc is the density [kg/m3] of the ceramic that constitutes the electrostatic chuck 1111.

Cc is the heat capacity per unit area [J/K·m2] of the ceramic comprising the electrostatic chuck 1111.

Zc is the distance [m] from the surface of the electrostatic chuck 1111 to the heater 200.

κc is the thermal conductivity [W/K·m] of the ceramic that constitutes the electrostatic chuck 1111.

t is the elapsed time [s] from the beginning of plasma formation.

The area A of the heater 200, the density pw of the ring assembly 112, the heat capacity Cw per unit area of the ring assembly 112, the thickness zw of the ring assembly 112, the density ρc of the ceramic that constitutes the electrostatic chuck 1111, the heat capacity Cc per unit area of the ceramic that constitutes the electrostatic chuck 1111, the distance zc from the surface of the electrostatic chuck 1111 to the heater 200, and the thermal conduction κc are predetermined from the configurations of the ring assembly 112 and the plasma processing apparatus 1. Rthc·A is predetermined from the thermal conduction Kc and distance zc with Equation (4).

The heater power Ph and the heater power Ph0 can be obtained by the configuration shown in FIG. 5. The amount of heat generation per unit area of heater 200, qh and qh0, can be calculated from the heater power Ph, the heater power Ph0, and the area A, as shown in Equations (2) and (3).

The heat flux qp and thermal resistance Rth·A can then be obtained from the measured results of the heater power Ph and the heater power Ph0 and from Equation (1), for example, by means of fitting.

The graph of the temperature of the ring assembly 112 in period T2 shown in (a) of FIG. 9 can also be modeled with the heat flux qp and the thermal resistance Rth·A as parameters. In this embodiment, the temperature change per unit area of ring assembly 112 in period T2 can be modeled. In one example, using the heat flux qp and the thermal resistance Rth·A, as well as a1, a2, a3, λ1, λ2, τ1 and τ2 shown in Equations (5)-(11), the temperature TW [° C.] of the ring assembly 112 can be expressed by Equation (12).

Where,

TW is the temperature [° C.] of the ring assembly 112.

Th is the temperature [° C.] of the heater 200 controlled at a constant level.

The temperature Th of the heater 200 can be determined from the actual conditions when the temperature of the ring assembly 112 is controlled at a constant level.

If the heat flux qp and the thermal resistance Rth·A are obtained by performing the fitting of equation (1) using the measurement results, the temperature TW of the ring assembly 112 can be calculated from equation (12).

When the elapsed time t is sufficiently longer than the time constants τ1 and τ2 expressed by formulas (10) and (11), for example, when calculating the temperature Th of the heater 200 at which the temperature TW of the ring assembly 112 becomes the target temperature after transition from the transient state, which is period T2 in FIG. 9, to the steady state, which is period T3, then formula (12) can be omitted as Equation (13).

For example, the temperature TW of the ring assembly 112 can be obtained from the heater temperature Th, the heat flux qp, and the thermal resistances Rth·A and Rthc·A using Equation (13).

As described above, the thermal resistance between the ring assembly 112 and the electrostatic chuck 111 and the temperature of the ring assembly 112 can be obtained.

(Process ST7: Determination of Repetition)

In step ST7, it is determined whether to repeat the steps ST4 to ST6. In step ST7, based on the thermal resistance calculated in step ST6, it is determined whether to repeat steps ST4 to ST6.

Figure 10:
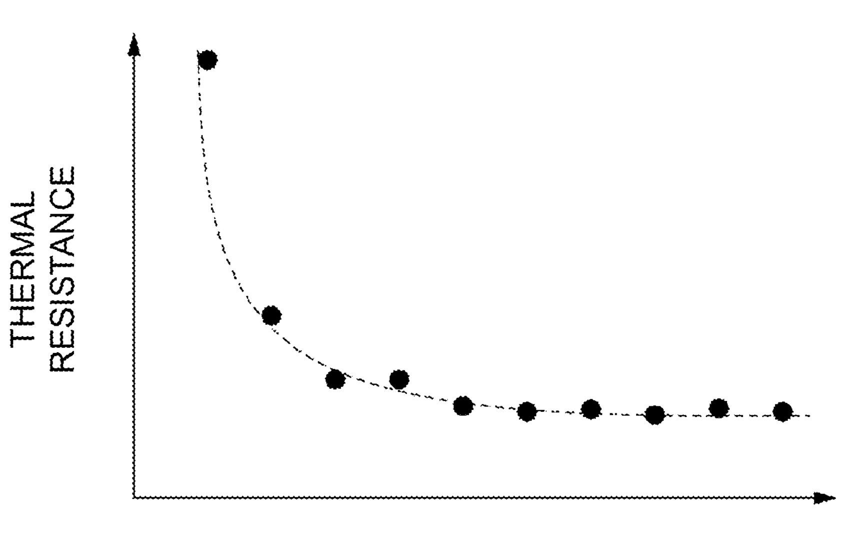
FIG. 10 shows an example of the relationship between the thermal resistance and the number of repetitions of steps ST4 to ST6.

FIG. 10 is a graph showing an example of the relationship between the thermal resistance and the number of repetitions of steps ST4 to ST6. There is a correlation between the amount of moisture present between the ring assembly 112 and the electrostatic chuck 111 and the thermal resistance between the ring assembly 112 and the electrostatic chuck 111. In other words, when step ST4 (the step of forming a plasma) is repeated, some or all of the moisture existing between the ring assembly 112 and the electrostatic chuck 1111 evaporates, and thus the thermal resistance between the ring assembly 112 and the electrostatic chuck 1111 can decrease, as shown in FIG. 10 as an example. Therefore, in step ST7, in one example, if the thermal resistance calculated in step ST6 is higher than the predetermined value, it may be determined to repeat steps ST4 to ST6. On the other hand, if the thermal resistance calculated in step ST6 is lower than the predetermined value, it may be determined that steps ST4 to ST6 are not repeated, and this processing method may be terminated. In one example, if the amount of decrease in thermal resistance due to the repetition of steps ST4 to ST6 is lower than the predetermined value, it may be determined that steps ST4 to ST6 need not be repeated. In other words, if the difference between the thermal resistance after executing step ST4 to step ST6 n times and the thermal resistance after executing step ST4 to step ST6 n+1 times becomes lower than the predetermined value, this processing method may determine that step ST4 to step ST6 need not be repeated, and terminate the method (n is an integer of 1 or more).

In step ST7, it may be determined whether to repeat steps ST2 to ST6 based on the thermal resistance calculated in step ST6. In one example, if the controller 2 determines in step ST7 that step ST2 to step ST6 is to be repeated, the controller 2 may remove the substrate W disposed on the electrostatic chuck 1111 from the electrostatic chuck 1111, return to step ST2, dispose another substrate W on the electrostatic chuck 1111, and execute step ST3 to step ST6. If the controller 2 determines in step ST7 that step ST2 to step ST6 are to be repeated, the controller 2 may remove the substrate W disposed on the electrostatic chuck 1111 from the electrostatic chuck 1111, return to step ST2, dispose the removed substrate W on the electrostatic chuck 1111 again, and execute step ST3 to step ST6.

According to one exemplary embodiment of the present disclosure, a technique for seasoning a ring assembly can be provided.

According to this processing method, the amount of moisture present between the ring assembly 112 and the electrostatic chuck 1111 can be detected based on the thermal resistance between the ring assembly 112 and the electrostatic chuck 1111. Thus, for example, at the time of replacing the ring assembly 112, it is possible to determine the plasma treatment execution time or the number of plasma treatment executions required to remove the moisture present between the ring assembly 112 and the electrostatic chuck 1111.

The above embodiments are described for illustrative purposes, and various variations can be made without departing from the scope and purpose of the present disclosure. The present disclosure may include, for example, the following configurations.

Addendum 1

A seasoning method implemented in a plasma processing apparatus, the plasma processing apparatus comprising a chamber and an electrostatic chuck, the electrostatic chuck including a central region which supports a substrate and an annular region which surrounds the central region and supports a ring assembly, the seasoning method including:

disposing the ring assembly on the annular region of the electrostatic chuck;

disposing the substrate on the central region of the electrostatic chuck;

forming a plasma in the chamber;

calculating a thermal resistance between the electrostatic chuck and the ring assembly; and determining, based on the calculated thermal resistance, whether to repeat the forming the plasma and the calculating the thermal resistance.

Addendum 2

The seasoning method according to addendum 1, further comprising: repeating the forming the plasma and the calculating thermal resistance, based on a determination result in the determining whether to repeat;

wherein the determining whether to repeat includes determining whether to further repeat the forming the plasma and the calculating the thermal resistance, based on a plurality of the thermal resistances calculated by repeating the forming the plasma and the calculating the thermal resistance.

Addendum 3

The seasoning method according to addendums 1 or 2, further including:

controlling supply power supplied to at least one heater so that a temperature of the at least one heater reaches setting temperature, the at least one heater being disposed in the electrostatic chuck; and measuring supply power supplied to the at least one of the heaters with a plasma being formed in the chamber;

wherein in the calculating the thermal resistance, the thermal resistance is calculated based on the supply power measured with the plasma being formed in the chamber.

Addendum 4

The seasoning method according to addendum 3, further including: measuring supply power supplied to the at least one heater with no plasma being formed in the chamber;

wherein in the calculating the thermal resistance, the thermal resistance is calculated further based on the supply power measured with no plasma being formed in the chamber.

Addendum 5

The seasoning method according to addendum 3 or 4, wherein in the calculating the thermal resistance, the thermal resistance is calculated based on an equation expressing a relationship among (a) an amount of heat transferred from the plasm to the ring assembly, (b) the thermal resistance between the ring assembly and the at least one heater and (c) the supply power supplied to the at least one heater with the plasma being formed in the chamber.

Addendum 6

The seasoning method according to addendums 3 to 5, wherein with the plasma being formed in the chamber, a temperature of the ring assembly changes over time by a thermal flux generated between the plasma and the ring assembly.

Addendum 7

The seasoning method according to any one of addendums 1 to 6, further including:

transferring with a transfer device, the ring assembly from outside the chamber to inside the chamber; and disposing with the transfer device, the ring assembly on at least partially on the electrostatic chuck.

Addendum 8

An plasma processing apparatus comprising: a chamber; an electrostatic chuck disposed in the chamber; and a controller, the electrostatic chuck including a central region which supports a substrate and an annular region which surrounds the central region and supports a ring assembly, wherein the controller executes controls of:

disposing the ring assembly on the annular region of the electrostatic chuck;

disposing the substrate on the central region of the electrostatic chuck;

forming a plasma in the chamber;

calculating a thermal resistance between the electrostatic chuck and the ring assembly; and determining, based on the calculated thermal resistance, whether to repeat the forming the plasma and the calculating the thermal resistance.

What is claims is:

1. A plasma processing apparatus comprising:

a chamber;

an electrostatic chuck disposed in the chamber, the electrostatic chuck including a central region and an annular region, the central region supporting a substrate and the annular region surrounding the central region and supporting a ring assembly; and a processor coupled to a memory storing instructions that, when executed by the processor, cause the processor to perform:

disposing the ring assembly on the annular region of the electrostatic chuck;

disposing the substrate on the central region of the electrostatic chuck;

forming a plasma in the chamber;

calculating a thermal resistance between the electrostatic chuck and the ring assembly;

repeating the forming the plasma and the calculating the thermal resistance; and determining whether to further repeat the forming the plasma and the calculating the thermal resistance based on a difference between the thermal resistance after performing the forming the plasma and the calculating the thermal resistance n times and the thermal resistance after performing the forming the plasma and the calculating the thermal resistance n+1 times, wherein n is an integer of 1 or more.

2. The plasma processing apparatus according to claim 1, the instructions further cause the processor to perform repeating the forming the plasma and the calculating thermal resistance, based on a determination result in the determining whether to repeat, wherein the determining whether to repeat includes determining whether to further repeat the forming the plasma and the calculating the thermal resistance, based on a plurality of thermal resistances calculated by repeating the forming the plasma and the calculating the thermal resistance.

3. The plasma processing apparatus according to claim 1, wherein the instructions further cause the processor to perform: controlling supply power supplied to at least one heater so that a temperature of the at least one heater reaches setting temperature, the at least one heater being disposed in the electrostatic chuck; and measuring supply power supplied to the at least one heater with a plasma being formed in the chamber, and wherein in the calculating the thermal resistance, the thermal resistance is calculated based on the supply power measured with the plasma being formed in the chamber.

4. The plasma processing apparatus according to claim 3, wherein the instructions further cause the processor to perform measuring supply power supplied to the at least one heater with no plasma being formed in the chamber, and wherein in the calculating the thermal resistance, the thermal resistance is calculated further based on the supply power measured with no plasma being formed in the chamber.

5. The plasma processing apparatus according to claim 3, wherein in the calculating the thermal resistance, at least one thermal resistance is calculated based on an equation expressing a relationship among (a) an amount of heat transferred from the plasma to the ring assembly, (b) a thermal resistance between the ring assembly and the at least one heater and (c) the supply power supplied to the at least one heater with the plasma being formed in the chamber.

6. The plasma processing apparatus according to claim 3, wherein with the plasma being formed in the chamber, a temperature of the ring assembly changes over time by a thermal flux generated between the plasma and the ring assembly.

7. The plasma processing apparatus according to claim 1, wherein the instructions further cause the processor to perform:

transferring with a transfer device, the ring assembly from outside the chamber to inside the chamber; and disposing with the transfer device, the ring assembly on at least partially on the electrostatic chuck.

8. The plasma processing apparatus according to claim 1, wherein the annular region has a plurality of zones in a plan view of the annular region, and the instructions cause the processor to perform the calculating the thermal resistance for each of the plurality of zones.

9. The plasma processing apparatus according to claim 3, wherein the annular region has a plurality of zones in a plan view of the annular region, the at least one heater is disposed in each of the plurality of zones, and the instructions cause the processor to perform:

the calculating the thermal resistance for each of the plurality of zones;

controlling supply power for each of the plurality of zones; and the measuring supply power for each of the plurality of zones.

10. The plasma processing apparatus according to claim 9, wherein at least one resistor is disposed, in the electrostatic chuck, in each of the plurality of zones, resistance of the at least one resistor varying with temperature, and the instructions cause the processor to perform the controlling supply power, in each of the plurality of zones, based on the resistance of the at least one resistor.

11. The plasma processing apparatus according to claim 10, wherein the at least one resistor is at least one thermistor.

12. The plasma processing apparatus according to claim 10, wherein, in the electrostatic chuck, the at least one heater is disposed between the ring assembly and the at least one resistor in each of the plurality of zones.

13. The plasma processing apparatus according to claim 12, wherein the at least one heater and the at least one resistor are at least partially overlapped in a plan view of the annular region.

* * * * *